United States Patent
Chiang et al.

(10) Patent No.: US 6,405,293 B1
(45) Date of Patent: Jun. 11, 2002

(54) SELECTIVELY ACCESSIBLE MEMORY BANKS FOR OPERATING IN ALTERNATELY READING OR WRITING MODES OF OPERATION

(75) Inventors: Kevin Chiang, Fremont; Shengquan Wu; Scott Li-Huan Jen, both of Sunnyvale, all of CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/532,372

(22) Filed: Mar. 21, 2000

(51) Int. Cl.$^7$ .................... G06F 12/00; G11C 7/00; G11C 8/00

(52) U.S. Cl. .................. 711/154; 711/157; 711/155; 711/156; 365/189.02; 365/230.02

(58) Field of Search ................. 711/154, 155, 711/156, 157; 365/189.02, 230.02

(56) References Cited

U.S. PATENT DOCUMENTS

| | | | | |
|---|---|---|---|---|
| 5,570,320 A | * | 10/1996 | Runas | 365/230.03 |
| 5,737,578 A | * | 4/1998 | Hennenhoefer | 395/500 |
| 6,266,751 B1 | * | 6/2001 | Niescier | 711/173 |
| 6,288,955 B1 | * | 9/2001 | Shibano | 365/201 |
| 6,295,571 B1 | * | 9/2001 | Scardamalia | 710/29 |

* cited by examiner

*Primary Examiner*—Do Hyun Yoo
*Assistant Examiner*—Kimberly N. McLean
(74) *Attorney, Agent, or Firm*—Townsend and Townsend and Crew LLP; Henry K. Woodward

(57) ABSTRACT

Two banks of memory are selectively accessed from a first interface terminal and a second interface terminal through multiplexer circuitry whereby one memory bank can be read by one terminal while the other memory bank is being updated from the other interface terminal. The multiplexer circuitry is controlled by a control register which responds to an operation code whereby either memory bank can be updated while the other memory bank is being read for hardware parameters, for example.

7 Claims, 1 Drawing Sheet

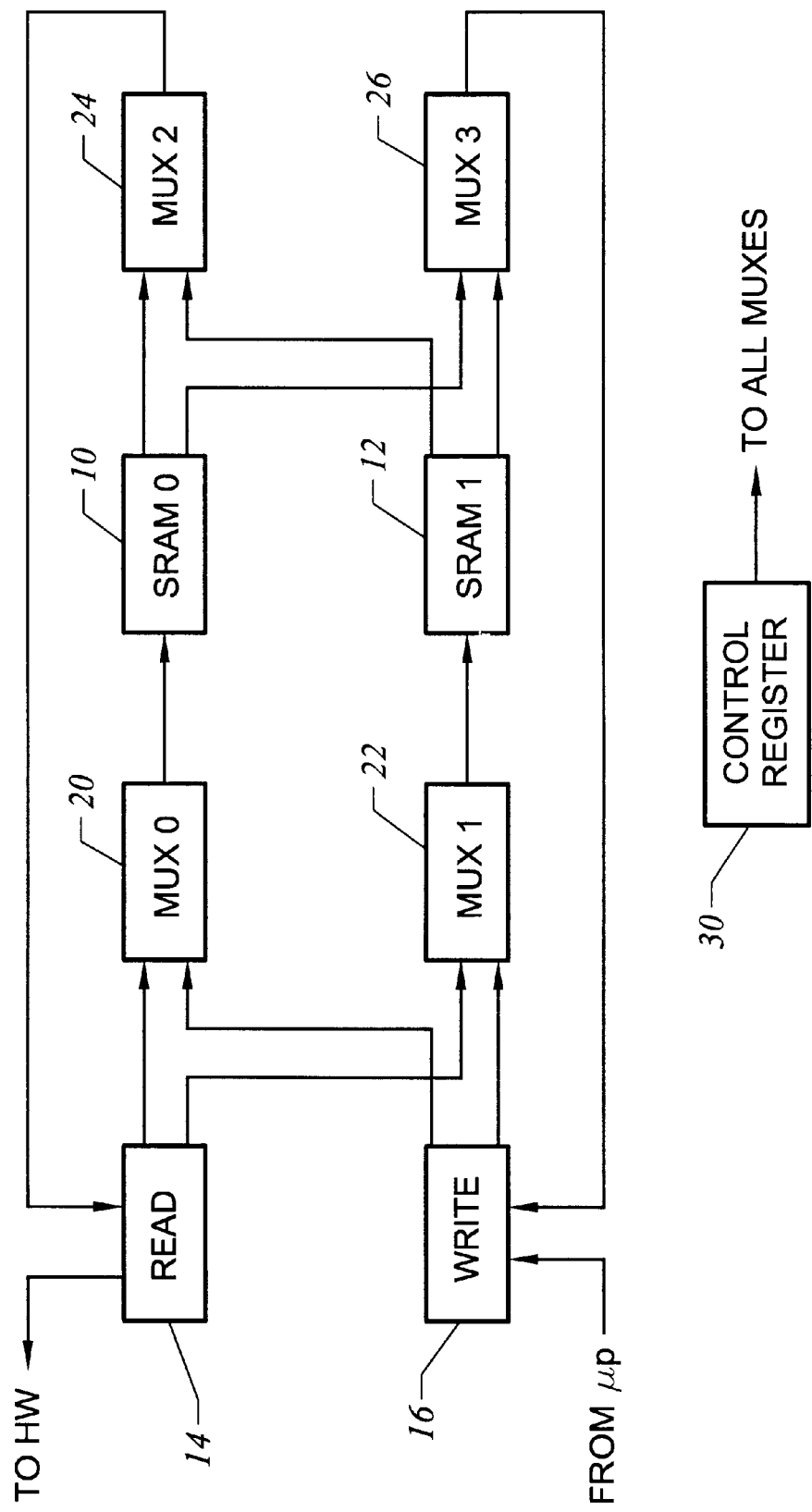

US 6,405,293 B1

SELECTIVELY ACCESSIBLE MEMORY BANKS FOR OPERATING IN ALTERNATELY READING OR WRITING MODES OF OPERATION

BACKGROUND OF THE INVENTION

This invention relates generally to computer memory systems, and more particularly the invention relates to data storage, data access, and data update in a memory system.

In computer systems memory must be provided for the continuous storage, update, and access of digital data. For example, the configuration of hardware in a computer system can be controlled by digital data or parameters stored in memory and periodically accessed for configuration and reconfiguration of the hardware. Typically, while a parameter is being used for hardware configuration, a new parameter is being stored for future hardware reconfiguration. This is often accomplished in two banks of memory which toggle between a read mode and a write mode.

Heretofore, the access of two banks of memory for alternating reading and writing of hardware parameters or other data has required complex circuitry. The present invention is directed to a more efficient method and apparatus for memory access and continually reading and writing data.

SUMMARY OF THE INVENTION

In accordance with the invention, two banks of memory are coupled to a first interface terminal provided for reading data from the two banks of memory and to a second interface terminal provided for writing data to the two banks of memory. The two terminals are coupled through multiplexers to selectively connect to either the first memory or to the second memory for accessing and writing data.

In one embodiment the stored data is hardware configuration parameters which are accessed for hardware control and updated by a processor for reconfiguration of the hardware.

In a preferred embodiment, a first multiplexer selectively applies the first terminal and the second terminal to the first memory bank, a second multiplexer selectively applies the first terminal and the second terminal to the second memory bank, a third multiplexer selectively applies the outputs of the first memory bank and the second memory bank to the first terminal, and a fourth multiplexer selectively applies the outputs of the first memory bank and the second memory bank to the second terminal. A control register responds to an operation code and directs the multiplexers in accessing the two banks of memory for read and write operations.

The invention and objects and features thereof will be more readily apparent from the following detailed description and appended claims when taken with the drawing.

BRIEF DESCRIPTION OF THE DRAWINGS

The drawing is a functional block diagram of a selectively accessible memory for reading and writing data in accordance with one embodiment of the invention.

DESCRIPTION OF THE ILLUSTRATIVE EMBODIMENTS

Referring now to the drawing, shown is a functional block diagram of a selectively accessible memory comprising a first memory bank SRAM0 shown at 10 and a second memory SRAM1 shown generally at 12. A read terminal is provided a control signal for the reading of data from memory banks 10, 12 to hardware, and a write terminal 16 is provided a control signal for the reading/writing of data to the memory banks 10, 12 under control of a microprocessor. As indicated above, one particular application of such a selectively accessible memory is in the configuration of hardware in which the two memory banks store hardware configuration parameters which are applied through read terminal 14 to the hardware with the configuration parameters being continually updated by a microprocessor through read/write terminal 16. In such an application the two memory banks will have alternating modes of operation whereby one memory bank provides a configuration parameter to hardware while the other memory bank is being updated.

In accordance with the invention the two terminals 14, 16 can be multiplexed to the memory banks 10, 12 for alternately reading from or writing to the two memory banks. Terminals 14, 16 each have two outputs with a first output of each terminal applied through multiplexer 20 (MUX0) to first memory bank 10 (SRAM0), with a second output of each terminal being applied through a second multiplexer 22 (MUX1) to the second memory bank 12 (SRAM1). Similarly, each memory bank has two outputs with an output of each memory bank being applied through a third multiplexer 24 (MUX2) back to terminal 14 and through a fourth multiplexer 26 (MUX3) to terminal 16. Accordingly, each terminal can address the memory banks and receive outputs from the memory banks. A control register 30 responds to an operation code provided by the microprocessor for controlling operation of the multiplexers. In one embodiment the operation code comprises two bits as follows:

OP Code 0,0: A normal mode of operation with parameters being accessed from SRAM0. The write terminal 16 is idle and the output of SRAM0 is provided through terminal 14. In an SRAM access mode, the read terminal 14 is idle and the data from SRAM0 is connected to the R/W terminal 16 for read only access by the microprocessor.

OP Code 0,1: In normal operation mode SRAM1 stores current parameters and SRAM0 is updated by the microprocessor. In an SRAM access mode, data can be written into SRAM0 while data is read from SRAM1.

OP Code 1,0: In a normal operating mode SRAM0 provides current parameters while SRAM1 is updated. In an SRAM access mode, data can be written into SRAM1 while data is read from SRAM0.

OP Code 1,1: A write only mode in which memory bank 0 is selected for a current parameter and in an SRAM access mode the microprocessor can write to both memory banks.

From the above description it will be appreciated that a multiplex circuitry in accordance with the invention allows flexibility in reading and accessing two banks of memory without the need for complicated circuitry. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A selectively accessible memory for reading and writing data comprising:

a) a first memory bank accessible for reading and writing data, b) a second memory bank accessible for reading and writing data, c) a first interface terminal selectively connectable to the first and second memory banks, d) a second interface terminal selectively connectable to the first and second memory banks, and e) multiplexer circuitry for selectively connecting the first interface terminal and a second interface terminal to the first and second memory banks for alternately reading and writing data in the first and second memory banks, the multiplexer circuitry comprising a first multiplexer for selectively connecting the first interface terminal and the second interface terminal to an input to the first memory bank, a second multiplexer for selectively connecting the first interface terminal and the second interface terminal to an input to the second memory bank, a third multiplexer for selectively connecting data outputs from the first memory bank and the second memory bank to the first terminal, and a fourth multiplexer for connecting data outputs from the first memory bank and the second memory bank to the second interface terminal.

2. The selectively accessible memory as defined by claim 1 wherein the first interface terminal selectively reads from the first and second memory banks, and the second interface terminal selectively writes data into the first and second memory banks.

3. The selectively accessible memory as defined by claim 2 wherein the multiplexer circuitry comprises a first multiplexer for selectively connecting the first interface terminal and the second interface terminal to an input to the first memory bank, a second multiplexer for selectively connecting the first interface terminal and the second interface terminal an input to the second memory bank, a third multiplexer for selectively connecting data outputs from the first memory bank and the second memory bank to the first terminal, and a fourth multiplexer for connecting data outputs from the first memory bank and the second memory bank to the second interface terminal.

4. The selectively accessible memory as defined by claim 3 and further including a control register responsive to an operation code for controlling the multiplexers in accordance with a desired mode of operation.

5. The selectively accessible memory as defined by claim 1 and further including a control register responsive to an operation code for controlling the multiplexers in accordance with a desired mode of operation.

6. A method of selectively accessing a memory bank for the reading and writing of data comprising the steps of a) providing first and second memory banks, b) providing first and second interface terminals for accessing the first and second memory banks, and c) selectively connecting the first and second terminals to the first and second memory banks for alternately reading and writing data to the memory banks including providing a first multiplexer for connecting the first and second terminals to an input to the first memory bank, a second multiplexer for connecting the first and second terminals to an input to the second memory bank, a third multiplexer for connecting data output from the first and second memory banks to the first terminal, and a fourth multiplexer for connecting data output from the first and second memory banks to the fourth terminal.

7. The method as defined by claim 6 and further including the step of providing a control register for controlling the operation of the multiplexer in response to an operation code.

* * * * *